United States Patent
Kaneguchi et al.

(10) Patent No.: US 12,439,721 B2
(45) Date of Patent: Oct. 7, 2025

(54) SOLID-STATE IMAGING DEVICE

(71) Applicant: SONY SEMICONDUCTOR SOLUTIONS CORPORATION, Kanagawa (JP)

(72) Inventors: Tokihisa Kaneguchi, Kanagawa (JP); Kan Shimizu, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 610 days.

(21) Appl. No.: 17/909,822

(22) PCT Filed: Mar. 17, 2021

(86) PCT No.: PCT/JP2021/010737
§ 371 (c)(1),
(2) Date: Sep. 7, 2022

(87) PCT Pub. No.: WO2021/193266
PCT Pub. Date: Sep. 30, 2021

(65) Prior Publication Data
US 2023/0103730 A1   Apr. 6, 2023

(30) Foreign Application Priority Data
Mar. 27, 2020   (JP) .................................. 2020-057974

(51) Int. Cl.
*H10F 39/00*   (2025.01)
*H10F 39/12*   (2025.01)

(52) U.S. Cl.
CPC ......... *H10F 39/811* (2025.01); *H10F 39/809* (2025.01); *H10F 39/199* (2025.01)

(58) Field of Classification Search
CPC ....... H01L 23/544; H01L 24/76; H01L 24/80; H01L 24/82; H10F 39/811; H10F 39/90;
(Continued)

(56) References Cited

U.S. PATENT DOCUMENTS

2009/0295979 A1   12/2009   Matsuo et al.
2015/0085169 A1   3/2015   Igarashi et al.
(Continued)

FOREIGN PATENT DOCUMENTS

JP   2009-290000   12/2009
JP   2014-157885   8/2014
(Continued)

OTHER PUBLICATIONS

International Search Report and Written Opinion prepared by the Japan Patent Office on May 31, 2021, for International Application No. PCT/JP2021/010737, 2 pgs.

*Primary Examiner* — Thanhha S Pham
(74) *Attorney, Agent, or Firm* — SHERIDAN ROSS P.C.

(57) ABSTRACT

A solid-state imaging device that includes a first substrate, one or multiple second substrates, a first wiring layer, a second wiring layer, and a first alignment part. The first substrate includes a first semiconductor substrate with multiple photoelectric conversion sections, and a multilayer wiring layer. The one or multiple second substrates are attached to the first substrate with the multilayer wiring layer interposed therebetween. The first wiring layer is in the multilayer wiring layer and includes multiple first thin metal wires formed at substantially the same first pitches. The second wiring layer is stacked above the first wiring layer in the multilayer wiring layer and includes multiple second thin metal wires formed between the multiple first thin metal wires at substantially the same second pitches in a plan view. The first alignment part is formed above the second wiring layer in the multilayer wiring layer.

20 Claims, 15 Drawing Sheets

(58) Field of Classification Search
CPC ........ H10F 39/95; H10F 39/199; H10F 39/12; H10K 59/60; H10K 59/65; H10K 59/90; H10K 59/95
See application file for complete search history.

(56) References Cited

U.S. PATENT DOCUMENTS

| | | |
|---|---|---|
| 2015/0348914 A1 | 12/2015 | Takazawa et al. |
| 2016/0126286 A1 | 5/2016 | Igarashi et al. |
| 2021/0098409 A1* | 4/2021 | Chen .................. H01L 23/544 |

FOREIGN PATENT DOCUMENTS

| | | |
|---|---|---|
| JP | 2019-216187 | 12/2019 |
| WO | WO 2013/179765 | 12/2013 |

* cited by examiner

SOLID-STATE IMAGING DEVICE

CROSS REFERENCE TO RELATED APPLICATIONS

This application is a national stage application under 35 U.S.C. 371 and claims the benefit of PCT Application No. PCT/JP2021/010737, having an international filing date of 17 Mar. 2021, which designated the United States, which PCT application claimed the benefit of Japanese Patent Application No. 2020-057974, filed 27 Mar. 2020, the entire disclosures of each of which are incorporated herein by reference.

TECHNICAL FIELD

The present disclosure relates to, for example, a solid-state imaging device of a back-illuminated type.

BACKGROUND ART

Recently, an improvement of function and an increase in number of functions of a semiconductor device have been promoted by joining wafers, chips, or the like different in characteristic, function, or the like. In such a semiconductor device, it is necessary to electrically couple multiple wafers, chips, or the like to each other, and their alignment is important. For example, PTL 1 discloses an imaging element that allows for improvement of alignment mark detection accuracy by providing a light-transmitting layer portion between an alignment mark and a light-shielding layer portion disposed on a rear side of the alignment mark.

CITATION LIST

Patent Literature

PTL 1: Japanese Unexamined Patent Application Publication No. 2014-157885

SUMMARY OF THE INVENTION

As described above, regarding an imaging element, it is desired to accurately perform alignment of various members with respect to a sensor substrate.

It is desirable to provide a solid-state imaging device that allows for highly accurate alignment.

A first solid-state imaging device according to one embodiment of the present technology includes a first substrate, one or multiple second substrates, a first wiring layer, a second wiring layer, and a first alignment part. The first substrate includes a first semiconductor substrate in which multiple photoelectric conversion sections are formed to be embedded, and a multilayer wiring layer formed on one surface side of the first semiconductor substrate. The multiple photoelectric conversion sections are included in a sensor pixel. The one or multiple second substrates are attached to the first substrate with the multilayer wiring layer interposed therebetween. The first wiring layer is provided in the multilayer wiring layer and includes multiple first thin metal wires formed at substantially the same first pitches. The second wiring layer is stacked above the first wiring layer in the multilayer wiring layer and includes multiple second thin metal wires formed between the multiple first thin metal wires at substantially the same second pitches in a plan view. The first alignment part is formed above the second wiring layer in the multilayer wiring layer.

A second solid-state imaging device according to one embodiment of the present technology includes a first substrate, one or multiple second substrates, a first alignment part, and a wiring layer. The first substrate includes a first semiconductor substrate in which multiple photoelectric conversion sections are formed to be embedded, and a multilayer wiring layer formed on one surface side of the first semiconductor substrate. The multiple photoelectric conversion sections are included in a sensor pixel. The one or multiple second substrates are attached to the first substrate with the multilayer wiring layer interposed therebetween. The first alignment part is provided in the multilayer wiring layer and is to be detected by detection light having a predetermined wavelength. The wiring layer is formed below the first alignment part in the multilayer wiring layer and includes multiple thin metal wires formed at a pitch smaller than the wavelength of the detection light.

In the first solid-state imaging device according to one embodiment of the present disclosure, the first wiring layer, the second wiring layer, and the first alignment part are provided in the multilayer wiring layer of the first substrate in which the first semiconductor substrate and the multilayer wiring layer are stacked on each other. The first semiconductor substrate is a substrate in which the multiple photoelectric conversion sections are formed to be embedded. The multiple photoelectric conversion sections are included in a sensor pixel. The first wiring layer includes the multiple first thin metal wires formed at substantially the same first pitches. The second wiring layer is stacked above the first wiring layer and includes the multiple second thin metal wires formed between the multiple first thin metal wires at substantially the same second pitches in a plan view. The first alignment part is formed above the second wiring layer in the multilayer wiring layer. In the second solid-state imaging device according to one embodiment of the present disclosure, the first alignment part and the wiring layer are provided in the multilayer wiring layer. The first alignment part is to be detected by the detection light having the predetermined wavelength. The wiring layer is formed below the first alignment part and includes the multiple thin metal wires formed at a pitch smaller than the wavelength of the detection light. Thus, a reflection region having a substantially uniform reflection characteristic is formed in a layer below the first alignment part.

MODES FOR CARRYING OUT THE INVENTION

The following describes an embodiment of the present disclosure in detail with reference to the drawings. The following description is a specific example of the present disclosure, but the present disclosure is not limited to the following modes. In addition, the present disclosure is also not limited to the disposition, dimensions, dimension ratios, and the like of the respective components illustrated in each of the diagrams. It is to be noted that the description is given in the following order.

1. First Embodiment (An example in which a reflection region of an alignment mark is formed over two or more layers)
 1-1. Outline Configuration of Solid-state Imaging Device
 1-2. Configuration of Alignment Mark
 1-3. Workings and Effects
2. Second Embodiment (An example in which the reflection region is formed with multiple thin metal wires patterned at a pitch smaller than a wavelength of detection light)
3. Application Examples
4. Practical Application Examples

1. FIRST EMBODIMENT

Figure 1:
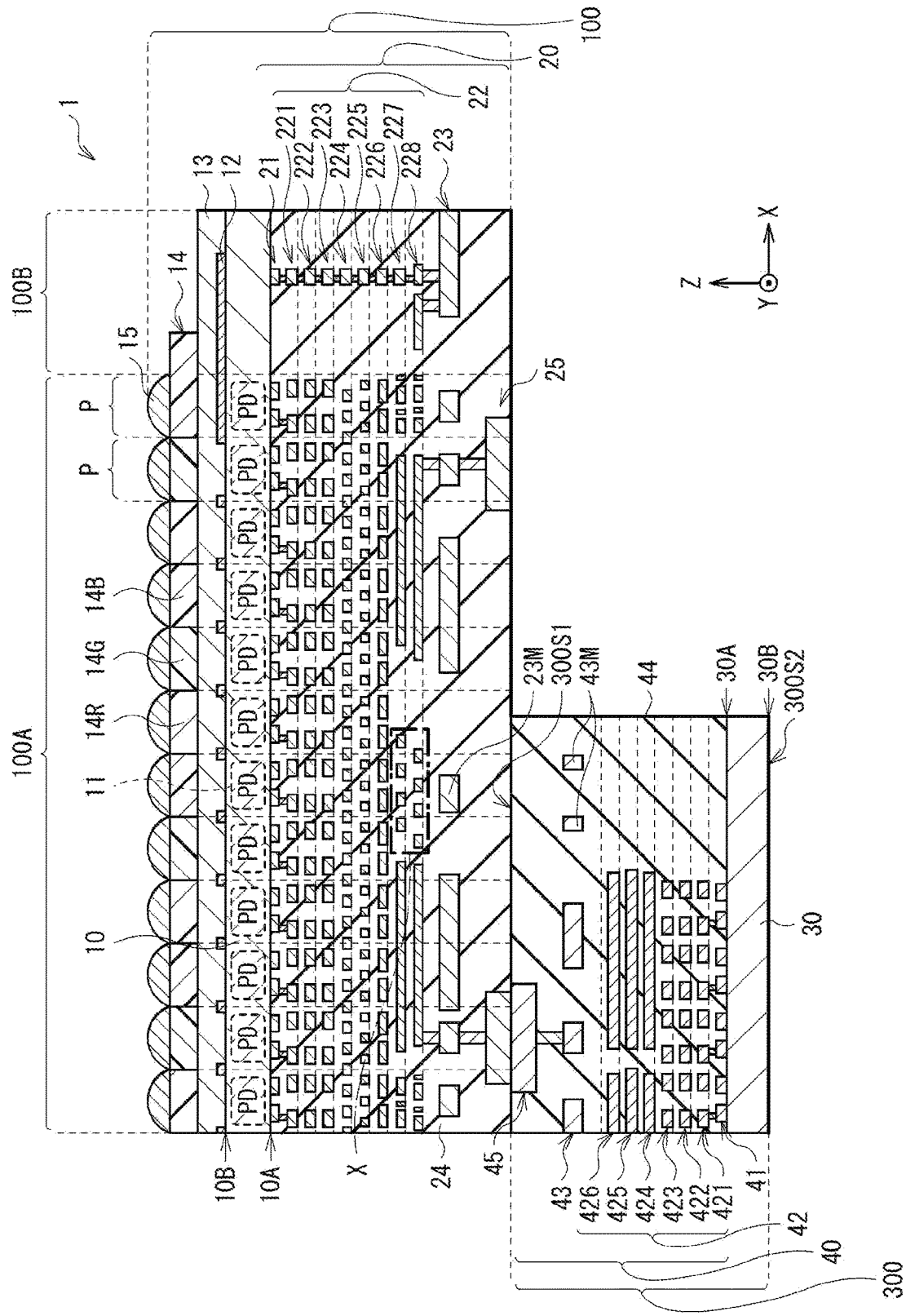
FIG. 1 is a schematic cross-sectional view of a configuration of a solid-state imaging device according to a first embodiment of the present disclosure.
Figure 2:
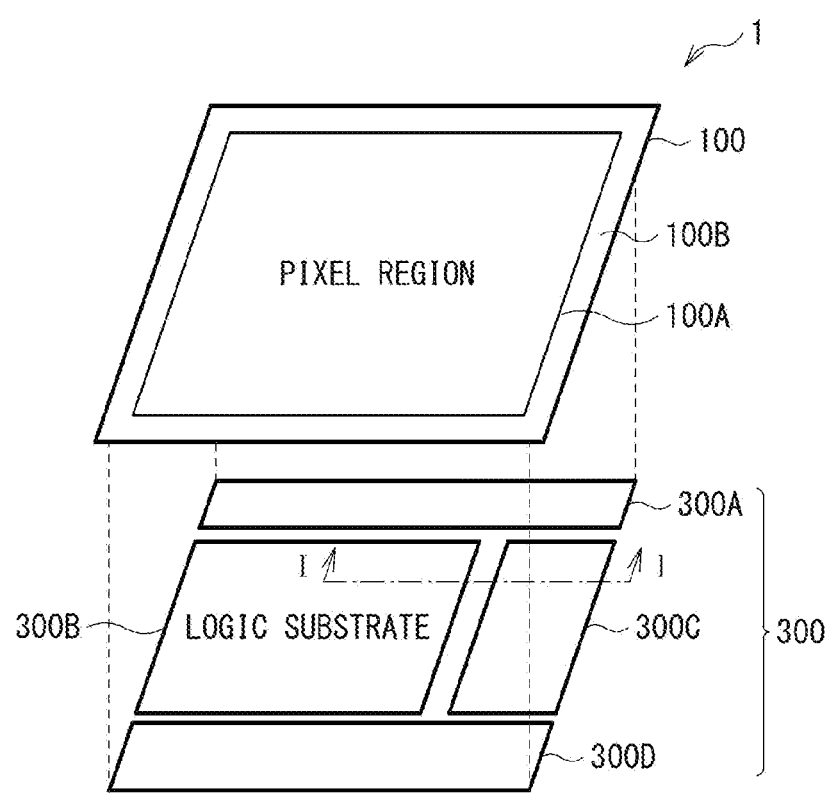
FIG. 2 is a schematic diagram illustrating an example of a stack structure of the solid-state imaging device illustrated in FIG. 1.

FIG. 1 schematically illustrates an example of a cross-sectional configuration of a solid-state imaging device (a solid-state imaging device 1) according to a first embodiment of the present disclosure. FIG. 2 is a schematic diagram illustrating an example of a stack structure of the solid-state imaging device 1 illustrated in FIG. 1. It is to be noted that FIG. 1 illustrates a cross section taken along a line I-I' illustrated in FIG. 2. The solid-state imaging device 1 is, for example, a CMOS (Complementary Metal Oxide Semiconductor) image sensor to be used in an electronic apparatus such as a digital still camera or a video camera. The solid-state imaging device 1 takes in incident light (image light) from a subject through an optical lens system (not illustrated), converts an amount of the incident light formed on an imaging surface into an electric signal on a pixel-unit basis, and outputs the electric signal as a pixel signal.

1-1. Outline Configuration of Solid-State Imaging Device

The solid-state imaging device 1 has a three-dimensional structure in which a first substrate 100 and multiple second substrates 300 (e.g., four second substrates 300A, 300B, 300C, and 300D) are stacked on each other. The first substrate 100 has a pixel region 100A in which multiple unit pixels P (sensor pixels) are disposed two-dimensionally in a matrix. In the multiple second substrates 300, a logic circuit, a memory, and the like are formed.

The first substrate 100 includes a first semiconductor substrate 10 and a multilayer wiring layer 20. The first semiconductor substrate 10 has a first surface (a front surface) 10A and a second surface (a rear surface) 10B that are opposed to each other. The multilayer wiring layer 20 is provided on the first surface 10A of the first semiconductor substrate 10. The second substrate 300 includes a second semiconductor substrate 30 and a multilayer wiring layer 40. The second semiconductor substrate 30 has a first surface (a front surface) 30A and a second surface (a rear surface) 30B that are opposed to each other. The multilayer wiring layer 40 is provided on the first surface 30A of the second semiconductor substrate 30. In the solid-state imaging device 1, the first substrate 100 and the second substrate 300 are stacked on each other with the multilayer wiring layer 20 provided on the first surface 10A of the first semiconductor substrate 10 and the multilayer wiring layer 40 provided on the first surface 30A of the second semiconductor substrate 30 interposed therebetween. This first semiconductor substrate 10 corresponds to a specific example of a "first semiconductor substrate" of the present disclosure, and the second semiconductor substrate 30 corresponds to a specific example of a "second semiconductor substrate" of the present disclosure.

The first substrate 100 is, for example, a sensor substrate. For example, multiple photodiodes (PD) 11 that perform photoelectric conversion are formed to be embedded in the first semiconductor substrate 10. The first surface 10A of the first semiconductor substrate 10 is provided with, for example, multiple transistors included in a pixel transistor (unillustrated). On a second surface 10B side of the first semiconductor substrate 10, a light-blocking film 12 is provided between the unit pixels P and from a peripheral portion of the pixel region 100A to a surrounding region 100B. In addition, a planarization film 13, a color filter 14, and an on-chip lens 15 are stacked in this order on the second surface 10B side of the first semiconductor substrate 10. Regarding the color filter 14, one of color filters 14R, 14G, and 14B corresponding to RGB is provided for each of the unit pixels P.

The multilayer wiring layer 20 is provided with multiple wiring layers 21, 22, and 23. The multiple wiring layers 21, 22, and 23 are provided in a layer of an interlayer insulation layer 24 in this order from the first surface 10A side of the first semiconductor substrate 10. The multiple wiring layers 21, 22, and 23 each include multiple wiring lines. For example, the wiring layer 21 is provided with a gate wiring line serving as respective gates of multiple transistors included in the pixel transistor. The wiring layer 22 is further provided with, for example, eight wiring layers, i.e., a first layer 221, a second layer 222, a third layer 223, a fourth layer 224, a fifth layer 225, a sixth layer 226, a seventh layer 227, and an eighth layer 228, as multiple wiring layers. The first layer 221, the second layer 222, the third layer 223, the fourth layer 224, the fifth layer 225, the sixth layer 226, the seventh layer 227, and the eighth layer 228 are provided in this order from the wiring layer 21 side. The wiring layer 23 is provided with a wiring line that is adapted for drawing, for example, together with the wiring layer provided in upper layers (e.g., the seventh layer 227 and the eighth layer 228) of the wiring layer 22, wiring lines provided in a lower layer to a pad electrode 25. For example, multiple pad electrodes 25 are exposed on a surface of the interlayer insulation layer 24. The multiple pad electrodes 25 are to be used for joining with the second substrates 300A, 300B, 300C, and 300D, for example. The wiring layers 21 and 22 and the pad electrodes 25 are formed using copper (Cu), for example. The wiring layer 23 is formed using aluminum (Al), for example.

The second substrate 300 (e.g., the second substrate 300A) is, for example, a logic substrate, and a logic circuit is provided on the first surface 30A of the second semiconductor substrate 30. The logic circuit controls a readout circuit and processes a pixel signal obtained from the readout circuit. For example, as illustrated in FIG. 3, the logic circuit includes a vertical drive circuit 311, a column signal processing circuit 312, a horizontal drive circuit 313, an output circuit 314, a control circuit 315, an input-output terminal 316, and a horizontal signal line 317.

The multilayer wiring layer 40 is provided with multiple wiring layers 41, 42, and 43. The multiple wiring layers 41, 42, and 43 are provided in a layer of an interlayer insulation layer 44 in this order from the first surface 30A side of the second semiconductor substrate 30. The multiple wiring layers 41, 42, and 43 each include multiple wiring lines. The wiring layer 41 is provided with, for example, a gate wiring line serving as respective gates of multiple transistors included in a logic circuit. The wiring layer 42 is further provided with, for example, six wiring layers, i.e., a first layer 421, a second layer 422, a third layer 423, a fourth layer 424, a fifth layer 425, and a sixth layer 426, as multiple wiring layers. The first layer 421, the second layer 422, the third layer 423, the fourth layer 424, the fifth layer 425, and the sixth layer 426 are provided in this order from the wiring layer 41 side. For example, multiple pad electrodes 45 are exposed on a surface of the interlayer insulation layer 44. The multiple pad electrodes 45 are to be used for joining with the first substrate 100. The wiring layers 41 and 42 and the pad electrodes 45 are formed using, for example, copper (Cu). The wiring layer 43 is formed using, for example, aluminum (Al).

Figure 3:
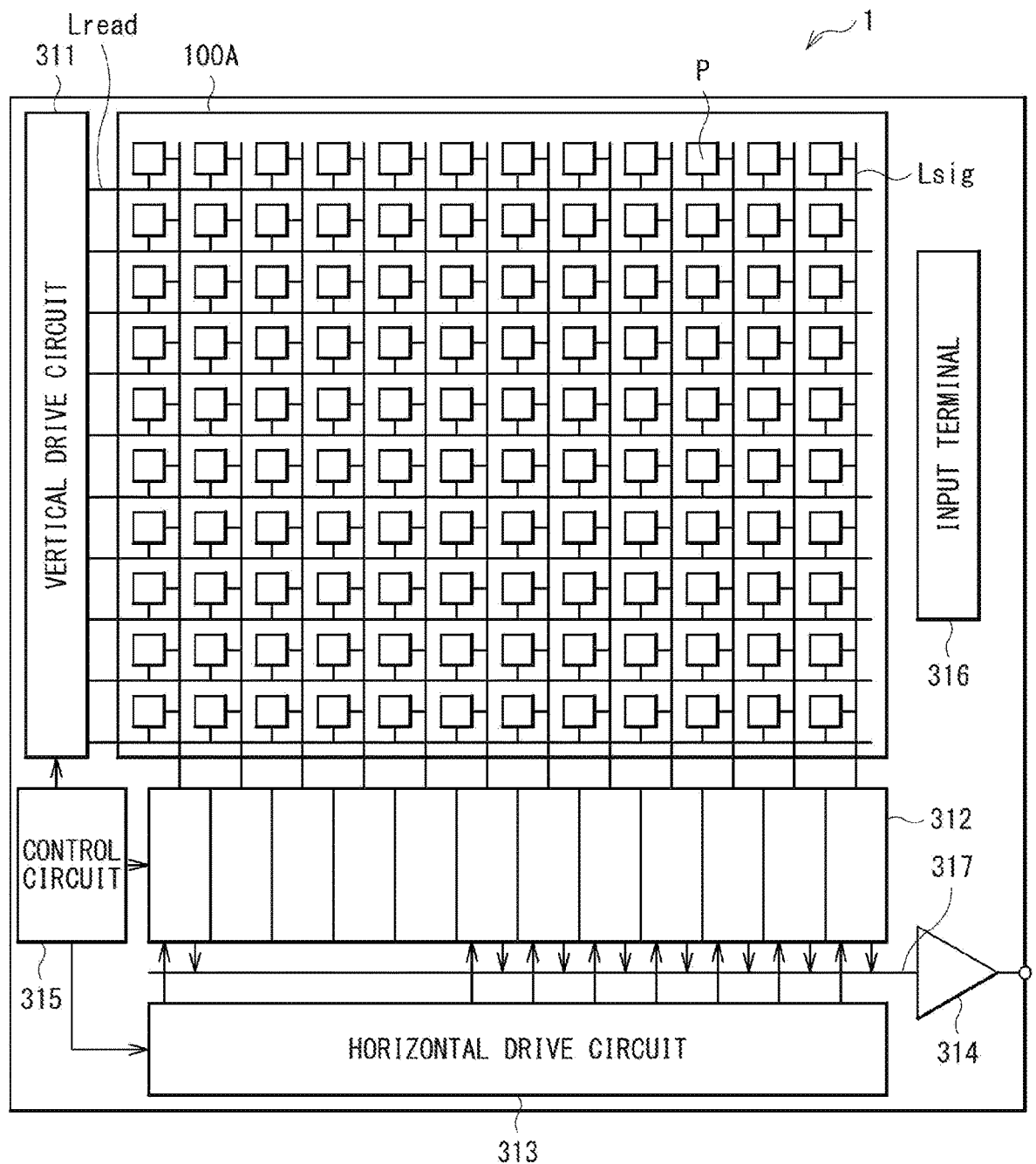
FIG. 3 is a block diagram illustrating an example of the configuration of the solid-state imaging device illustrated in FIG. 1.

FIG. 3 is a block diagram illustrating an example of a configuration of the solid-state imaging device 1 illustrated in FIG. 1. The pixel region 100A includes, for example, the multiple unit pixels P disposed two-dimensionally in a matrix. For example, these unit pixels P are provided with pixel drive lines Lread (specifically, row selection lines and reset control lines) for respective pixel rows, and are provided with vertical signal lines Lsig for respective pixel columns. The pixel drive line Lread is adapted to transmitting a drive signal for reading out a signal from a pixel. One end of the pixel drive line Lread is coupled to an output end corresponding to each row of the vertical drive circuit 311.

The vertical drive circuit 311 includes a shift register, an address decoder, and the like. The vertical drive circuit 311 is, for example, a pixel driver that drives each of the unit pixels P in the pixel region 100A on a row-unit basis. Respective signals outputted from the unit pixels Pin the pixel row selectively scanned by the vertical drive circuit 311 are supplied to the column signal processing circuit 312 through each of the vertical signal lines Lsig. The column signal processing circuit 312 includes an amplifier, a horizontal selection switch, and the like that are provided for each of the vertical signal lines Lsig.

The horizontal drive circuit 313 includes a shift register, an address decoder, and the like. The horizontal drive circuit 313 drives the respective horizontal selection switches of the column signal processing circuits 312 in order while scanning the horizontal selection switches. This selective scanning by the horizontal drive circuit 313 causes the respective signals of the pixels transmitted through each of the vertical signal lines Lsig to be outputted to the horizontal signal line 317 in order and causes the signals to be transmitted, for example, to outside of the second semiconductor substrate 30 through the horizontal signal line 317.

The output circuit 314 performs signal processing on signals sequentially supplied from the respective column signal processing circuits 312 through the horizontal signal line 317 and outputs the signals. For example, the output circuit 314 performs only buffering in some cases, and performs black level adjustment, column variation correction, various kinds of digital signal processing, and the like in other cases.

A circuit portion including the vertical drive circuit 311, the column signal processing circuit 312, the horizontal drive circuit 313, the horizontal signal line 317, and the output circuit 314 may be formed directly on the second semiconductor substrate 30 or may be provided in an external control IC. In addition, the circuit portion may be formed in another substrate coupled by a cable or the like.

The control circuit 315 receives, for example, a clock supplied from the outside of the second semiconductor substrate 30, data for an instruction about an operation mode, and the like, and in addition, outputs data such as internal information regarding the solid-state imaging device 1. The control circuit 315 further includes a timing generator that generates various timing signals. The control circuit 315 performs a drive control of peripheral circuits, including the vertical drive circuit 311, the column signal processing circuit 312, the horizontal drive circuit 313, and the like, on the basis of the various timing signals generated by the timing generator.

The input-output terminal 316 exchanges signals with the outside.

1-2. Configuration of Alignment Mark

Alignment between the first substrate 100 and the multiple second substrates 300 (300A, 300B, 300C, and 300D) is performed, for example, by means of infrared-light alignment using, as alignment light, infrared light that is able to pass through the second substrates 300. In the present embodiment, a reflection region X is formed using multiple thin metal wires formed in each of two layers. The reflection region X substantially uniformly reflects the alignment light used for alignment in joining the first substrate 100 and the multiple second substrates 300A, 300B, 300C, and 300D.

In general, an alignment mark includes a mark (metal) that reflects the alignment light and a background (a region other than the mark) that transmits the alignment light. This mark is irradiated with the alignment light, and edge detection of the mark is performed with use of transmitted light or reflected light to visually recognize a position. In order to increase accuracy of alignment between chips, a layout is so made as to have a characteristic shape when the marks of the two chips are visually recognized at the same time. This makes it possible to join the chips with high accuracy while recognizing the respective positions of the marks of the two chips at the same time.

In the solid-state imaging device 1 of the present embodiment, a pair of alignment marks 23M and 43M and the reflection region X are provided in the multilayer wiring layers 20 and 40 of the first substrate 100 and the second substrate 300. The pair of the alignment marks 23M and 43M are to be used for the alignment in joining the first substrate 100 and the multiple second substrates 300A, 300B, 300C, and 300D. The reflection region X serves as a background and uniformly reflects the alignment light (the infrared light).

The alignment marks 23M and 43M are formed in the vicinity of joining surfaces 100S2 and 300S1 of the first substrate 100 and the second substrate 300, respectively. Specifically, the alignment mark 23M is formed, for example, in a layer of the wiring layer 23 included in the multilayer wiring layer 20 in the pixel region 100A. The alignment mark 43M is formed, for example, in a peripheral portion called a scribe line in a layer of the wiring layer 43 included in the multilayer wiring layer 40. The alignment mark 23M corresponds to a "first alignment part" of the present disclosure, and the alignment mark 43M corresponds to a "second alignment part" of the present disclosure.

The reflection region X is formed, for example, below the alignment mark 23M in a plan view. The reflection region X includes multiple thin metal wires formed in multiple layers. Specifically, the reflection region X includes multiple thin metal wires 227X1, 227X2, 227X3, and 228X4 and thin metal wires 228X1, 228X2, 228X3, and 228X4 that are provided in the respective two layers (the seventh layer 227 and the eighth layer 228) in the upper layers in the wiring layer 22 provided in a layer lower than the wiring layer 23 provided with the alignment mark 23M. The two layers (the seventh layer 227 and the eighth layer 228) have smaller wiring densities as compared with other wiring layers and have higher degree of freedom in wiring layout. The seventh layer 227 corresponds to a specific example of a "first wiring layer" of the present disclosure, and the multiple thin metal wires 227X1, 227X2, 227X3, and 227X4 correspond to "multiple first thin metal wires" of the present disclosure. The eighth layer 228 corresponds to a specific example of a "second wiring layer" of the present disclosure, and the multiple thin metal wires 228X1, 228X2, 228X3, and 228X4 correspond to "multiple second thin metal wires" of the present disclosure.

Figure 4:
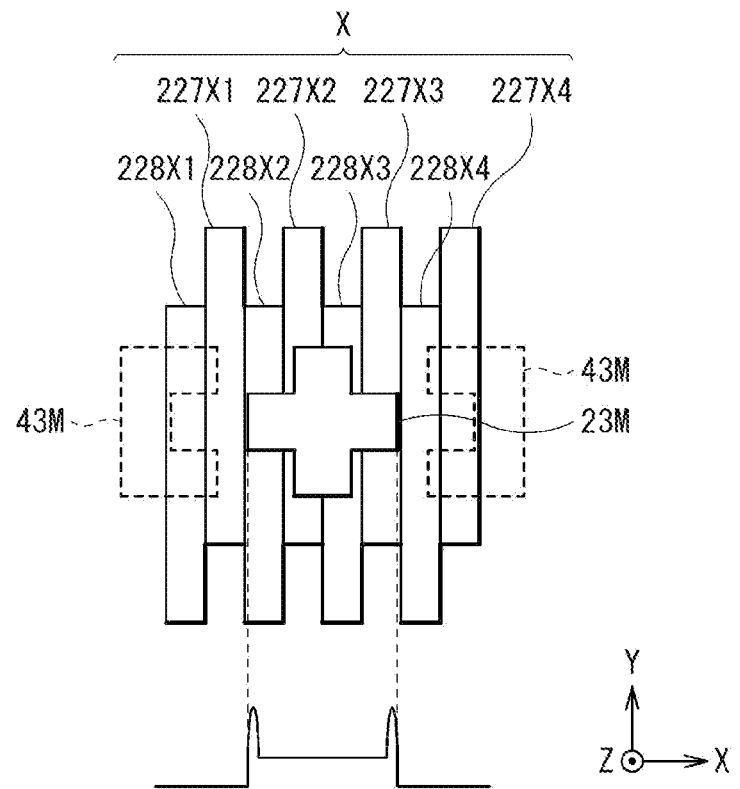
FIG. 4 is a diagram illustrating an example of a plan layout of alignment marks and multiple thin metal wires included in a reflection region illustrated in FIG. 1 and illustrating intensity of edge contrast obtained thereby.

For example, as illustrated in FIG. 4, the thin metal wires 227X1, 227X2, 227X3, and 228X4 and the thin metal wires 228X1, 228X2, 228X3, and 228X4 are disposed alternately at respective predetermined pitches with the interlayer insulation layer 24 interposed therebetween. Thus, the reflection region X having a uniform reflection characteristic is formed below the alignment mark 23M. In the present embodiment, the seventh layer 227 and the eighth layer 228 are formed using copper (Cu), and the alignment mark 23M is formed using aluminum (Al). Cu and Al have respective optical constants different from each other, and differ in reflectance with respect to the infrared light. Therefore, it is possible to obtain edge contrast of the alignment mark 23M by means of infrared-light irradiation, for example, as illustrated in FIG. 4. Detection thereof allows for alignment of the first substrate 100 with respect to the second substrate 300, for example, in the pixel region 100A.

The alignment marks 23M and 43M, and the thin metal wires 227X1, 227X2, 227X3, and 228X4 and the thin metal wires 228X1, 228X2, 228X3, and 228X4 included in the reflection region X described above are able to be formed by a common method of forming a wiring layer.

Further, in the present embodiment, detection of the alignment marks 23M and 43M are performed by applying the infrared light from the surface 300S2 side which is the opposite side to the joining surface 300S1 of the second substrate 300. Therefore, it is desirable that no other wiring pattern be formed above the alignment marks 23M and 43M and between the alignment mark 23M and the thin metal wires 227X1, 227X2, 227X3, and 228X4 and the thin metal wires 228X1, 228X2, 228X3, and 228X4 included in the reflection region X. This makes it possible to detect the alignment marks 23M and 43M with high accuracy.

It is to be noted that the two-dimensional layout of the alignment mark 23M is not limited to a cross type illustrated in FIG. 4. For example, it is sufficient that the alignment mark 23M includes an extending portion that extends across, for example, the multiple thin metal wires 227X1, 227X2, 227X3, and 228X4 or the multiple thin metal wires 228X1, 228X2, 228X3, and 228X4 in a direction intersecting with an extending direction of the thin metal wires 227X1, 227X2, 227X3, and 228X4 and the thin metal wires 228X1, 228X2, 228X3, and 228X4.

Further, FIG. 4 illustrates an example in which the thin metal wires 227X1, 227X2, 227X3, and 228X4 and the thin metal wires 228X1, 228X2, 228X3, and 228X4 are disposed alternately with no gap in a plan view; however, this is non-limiting. It is sufficient that the reflection region X has the substantially uniform reflection characteristic and that the thin metal wires 227X1, 227X2, 227X3, and 228X4 and the thin metal wires 228X1, 228X2, 228X3, and 228X4 are disposed periodically and alternately.

Figure 5:
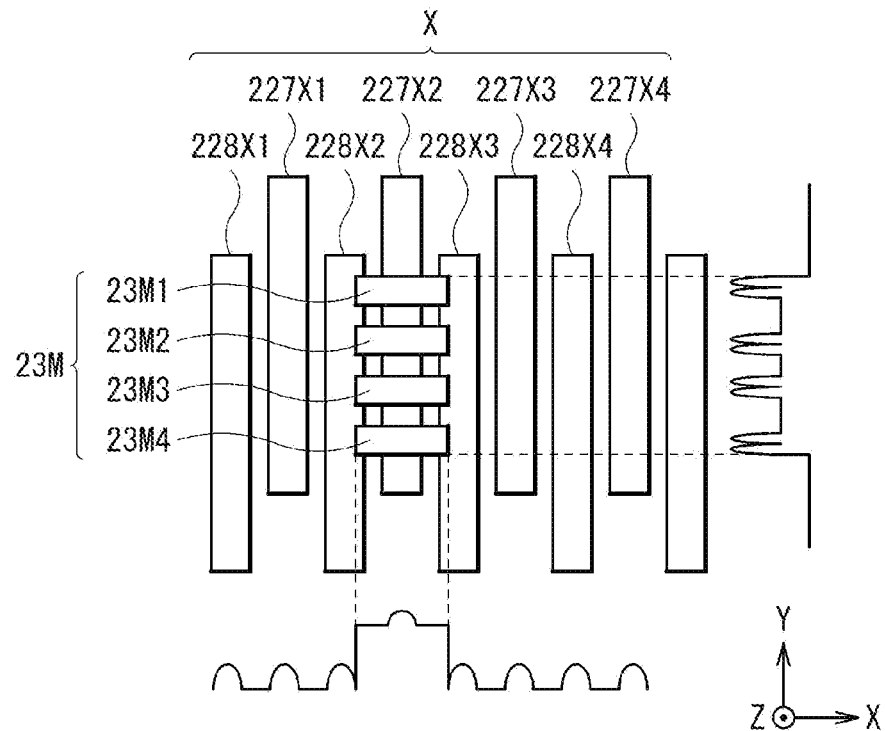
FIG. 5 is a diagram illustrating another example of the plan layout of the alignment mark and the multiple thin metal wires included in the reflection region according to the present embodiment and illustrating intensity of edge contrast obtained thereby.

As another example of a specific two-dimensional layout of the alignment mark 23M and the layout of the thin metal wires 227X1, 227X2, 227X3, and 228X4 and the thin metal wires 228X1, 228X2, 228X3, and 228X4, for example, a layout illustrated in FIG. 5 may be referred to. The thin metal wires 227X1, 227X2, 227X3, and 228X4 and the thin metal wires 228X1, 228X2, 228X3, and 228X4 are disposed periodically and alternately with predetermined gaps between thin metal wires adjacent to each other in a plan view. The alignment mark 23M extends in an orthogonal direction (an X-axis direction) with respect to the thin metal wires 227X1, 227X2, 227X3, and 228X4 and the thin metal wires 228X1, 228X2, 228X3, and 228X4 that extend in a Y-axis direction, and has a shape in which multiple marks 23M1, 23M2, 23M3, and 23M4 provided from the thin metal wire 228X2 to the thin metal wire 228X3 are arranged in the Y-axis direction.

In such a case where there are gaps between the multiple thin metal wires forming the reflection region X, the alignment mark 23M preferably has a two-dimensional layout in which misalignment in the X-axis direction and misalignment in the Y-axis direction are allowed to be measured independently of each other.

Further, as illustrated in FIG. 5, the marks 23M1, 23M2, 23M3, and 23M4 provided from one to the other of the multiple thin metal wires preferably have end portions formed on the thin metal wires. This makes it possible to obtain edge contrast of the end portions of the marks 23M1, 23M2, 23M3, and 23M4. It is therefore possible to detect the alignment marks 23M and 43M with high accuracy.

It is to be noted that in a case where there are gaps between the multiple thin metal wires forming the reflection region X, the infrared light may be reflected from below the seventh layer 227. However, such reflected light has a uniform pitch, and is therefore removable by signal processing, image processing, or the like.

Figure 6:
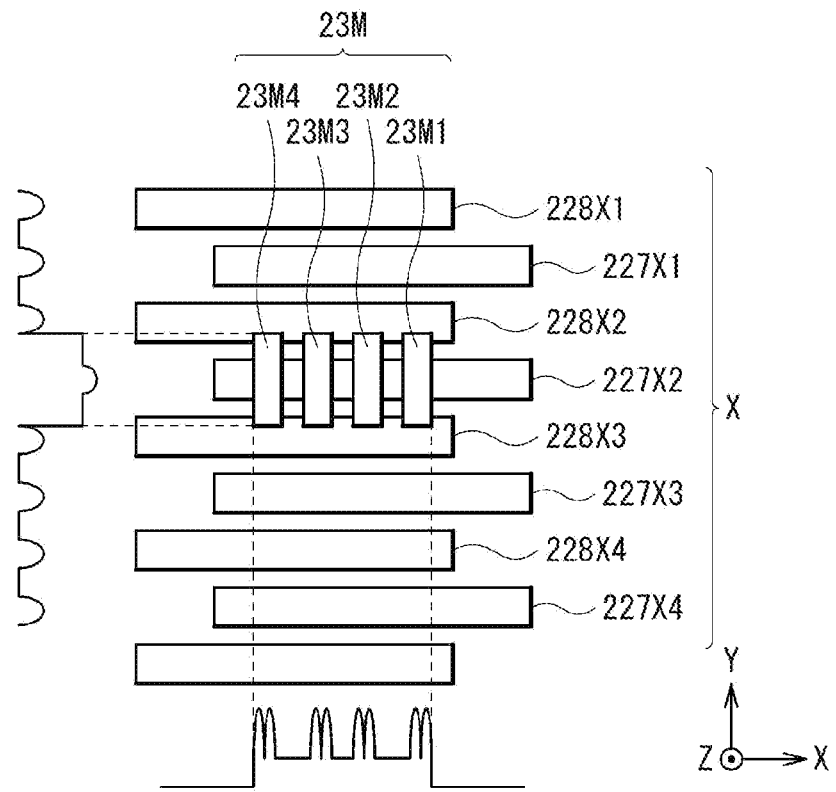
FIG. 6 is a diagram illustrating another example of the plan layout of the alignment mark and the multiple thin metal wires included in the reflection region according to the present embodiment and illustrating intensity of edge contrast obtained thereby.

Further, FIGS. 1, 4, and 5 each illustrate an example in which the thin metal wires 227X1, 227X2, 227X3, and 228X4 and the thin metal wires 228X1, 228X2, 228X3, and 228X4 included in the reflection region X extend in the Y-axis direction; however, this is non-limiting. For example, as illustrated in FIG. 6, the reflection region X may include the thin metal wires 227X1, 227X2, 227X3, and 228X4 and the thin metal wires 228X1, 228X2, 228X3, and 228X4 extending in the X-axis direction. In such a case, for example, the multiple marks 23M1, 23M2, 23M3, and 23M4 included in the alignment mark 23M preferably have respective extending portions extending in the Y-axis direction, and preferably have respective shapes arranged in the X-axis direction.

Further, FIGS. 1 and 4 to 6 each illustrate an example in which the thin metal wires 227X1, 227X2, 227X3, and 228X4 and the thin metal wires 228X1, 228X2, 228X3, and 228X4 included in the reflection region X extend in one direction; however, this is non-limiting. It is sufficient that the thin metal wires 227X1, 227X2, 227X3, and 228X4 and the thin metal wires 228X1, 228X2, 228X3, and 228X4 are disposed periodically and alternately as described above. Accordingly, for example, they may be formed in a serpentine shape or in a zig-zag shape, for example.

Furthermore, it is possible to further improve the intensity (viewability) of the edge contrast of the alignment mark 23M, for example, by forming the thin metal wires 227X1, 227X2, 227X3, and 228X4 and the thin metal wires 228X1, 228X2, 228X3, and 228X4 included in the reflection region X with a stack structure of copper (Cu) and, for example, titanium (Ti) (Ti (upper layer)/Cu (lower layer)). The stack structure of copper (Cu) and titanium (Ti) has an optical constant different from those of the thin metal wires included in the reflection region X (the thin metal wires 227X1, 227X2, 227X3, and 228X4 and the thin metal wires 228X1, 228X2, 228X3, and 228X4) and the alignment mark on the second substrate 300 side (the alignment mark 43M).

The intensity of the edge contrast of the alignment mark depends on the wavelength of the alignment light. Contrast is used as this index. The edge contrast is a difference between intensity of reflection from the alignment mark and intensity of reflection from a part (the background) other than the alignment mark. The intensity of the edge contrast is obtainable, for example, from the wavelength of about 1025 nm, and peaks at the wavelength of about 1175 nm.

A determination base of the contrast allowing for alignment is 0.03. For example, as illustrated in FIG. 7, in a case where an alignment mark M is formed with Al (film thickness of 600 nm) in a film of a SiO2 film 1020 (film thickness of 1000 nm), a reflection region X1 is formed with a Cu film (film thickness of 300 nm), a Si substrate 1010 (film thickness of 775 µm) is stacked on the SiO2 film 1020, and the alignment light is applied from the Si substrate 1010 side, the determination base (0.03) is to be satisfied from the wavelength of about 1100 nm.

Figure 7:
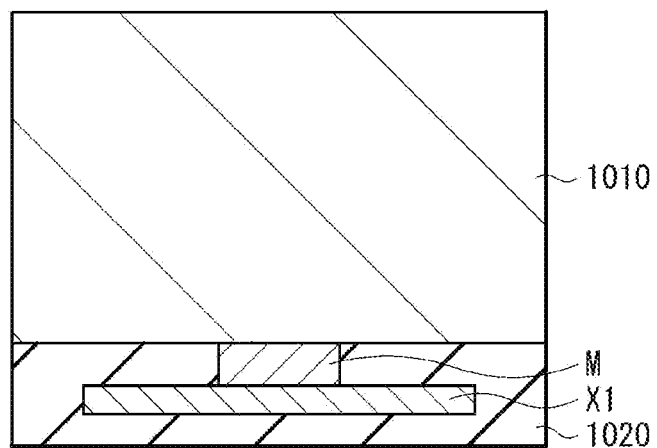
FIG. 7 is a schematic cross-sectional diagram describing an example of a configuration of the reflection region.
Figure 8:
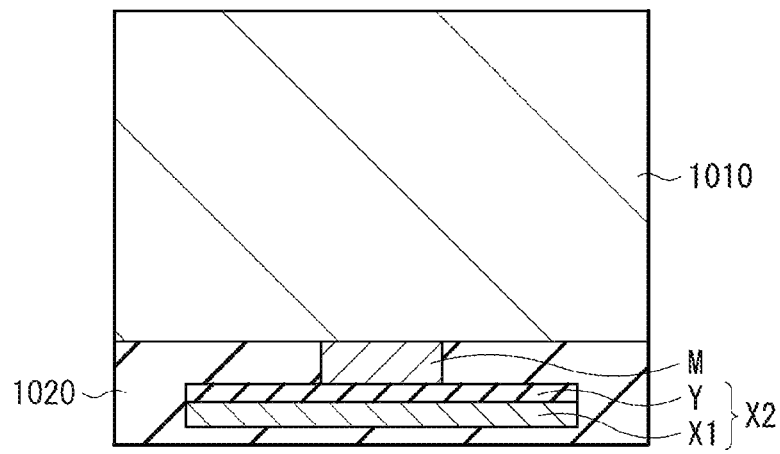
FIG. 8 is a schematic cross-sectional diagram describing another example of the configuration of the reflection region.
Figure 9:
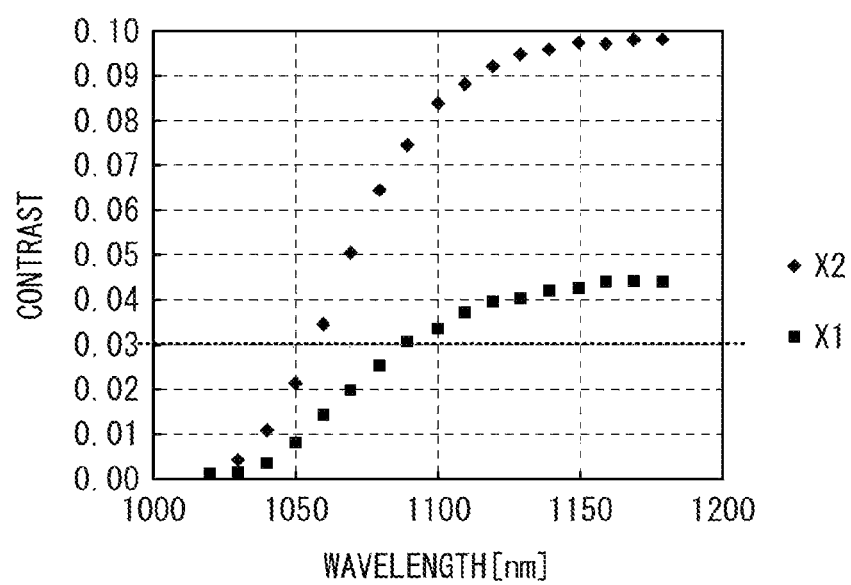
FIG. 9 is a characteristic diagram illustrating an alignment light source wavelength dependency of the configuration of the reflection region.

In contrast, it can be appreciated, as illustrated in FIG. 9 that, for example, in a case where a stacked film including a Cu film (film thickness of 300 nm) and a Ti (Ti) film Y (film thickness of 50 nm) is used as a reflection region X2 as illustrated in FIG. 8, increasing the wavelength of the alignment light to 1150 nm or greater makes it possible to obtain the contrast of twice or three times higher (about 0.10) as compared with the structure illustrated in FIG. 7.

1-3. Workings and Effects

In the solid-state imaging device 1 of the present embodiment, the multiple thin metal wires are disposed in each of the multiple wiring layers in layers lower than the wiring layer 23 provided in the alignment mark 23M in the multilayer wiring layer 20 of the first substrate 100. The multiple thin metal wires are formed at substantially the same pitches and disposed alternately in a plan view. Thus, the reflection region X having a substantially uniform reflection characteristic is formed below the alignment mark 23M. This is described below.

As described above, recently, an improvement of function and an increase in number of functions of a semiconductor device have been promoted by joining wafers, chips, or the like different in characteristic, function, or the like. As a joining method, there are Wafer to Wafer, Chip to Wafer, and Chip to Chip.

Devices need to be electrically coupled to each other, and are therefore required to be joined with misalignment within a limit of such a design rule. Accordingly, a joining apparatus recognizes the positions of the alignment marks disposed on the respective devices by means of a microscope, aligns the positions of the two, and perform joining. In general, the alignment mark is disposed on a scribe line, in a non-device region in a chip, or the like, and includes a mark (metal) that reflects the alignment light and a background (a region other than the mark) that transmits the alignment light. This mark is irradiated with the alignment light, and edge detection of the mark is performed with use of transmitted light or reflected light to visually recognize a position. In order to increase accuracy of alignment between chips, a layout is so made as to have a characteristic shape when the marks of the two chips are visually recognized at the same time, as described above. This makes it possible to join the chips with high accuracy while recognizing the respective positions of the marks of the two chips at the same time. Another method is to use two visible-light microscopes and detect the positions of the alignment marks by the respective microscopes. However, this method involves an issue of low alignment accuracy due to a difference between the microscopes, an adjustment error, or the like.

Incidentally, for a purpose of further improvement in function and a further increase in number of functions of a semiconductor device, development of a multi-chip CoW (Chip on Wafer) technique joining multiple chips with respect to one chip has been advanced. For example, consideration has been given to join multiple chips, including a control circuit chip, a memory chip, and the like, to a pixel chip of one CMOS image sensor. In a case where multiple chips are joined with respect to one pixel chip in such a manner, the multiple chips are sometimes disposed at respective positions directly opposed to a pixel region of the pixel chip. In general, fine wiring lines including metal such as copper (Cu) or aluminum (Al) are disposed in the pixel region. The wiring lines in the pixel region are disposed at random. For example, the wiring lines in the pixel region have different layouts for the respective wiring layers. Therefore, it is difficult to produce characteristic two-dimensional light intensity with reflection and transmission of the alignment light. That is, it is difficult to dispose the alignment mark in the pixel region, and it is an issue to secure positional accuracy upon joining.

In contrast, in the present embodiment, in the multilayer wiring layer 20 of the first substrate 100 to be joined with the multiple second substrates 300, the multiple thin metal wires are disposed in each of the multiple wiring layers in layers lower than the wiring layer 23 provided in the alignment mark 23M. The multiple thin metal wires are formed at substantially the same pitches and disposed alternately in a plan view. Specifically, the multiple thin metal wires 227X1, 227X2, 227X3, 227X4, 228 X1, 228X2, 228X3, and 228X4 are provided in the two upper layers (the seventh layer 227 and the eighth layer 228) having low wiring densities of the multiple wiring layers (the first layer 221, the second layer 222, the third layer 223, the fourth layer 224, the fifth layer 225, the sixth layer 226, the seventh layer 227, and the eighth layer 228) included in the wiring layer 22. The multiple thin metal wires 227X1, 227X2, 227X3, 227X4, 228 X1, 228X2, 228X3, and 228X4 are formed at substantially the same pitches and disposed alternately in a plan view. Thus, the reflection region X having a substantially uniform reflection characteristic is formed below the alignment mark 23M.

As described above, in the solid-state imaging device 1 of the present embodiment, the multiple thin metal wires 227X1, 227X2, 227X3, 227X4, 228 X1, 228X2, 228X3, and 228X4 are provided, below the alignment mark 23M, in multiple wiring layers formed in layers lower than the wiring layer 23 provided with the alignment mark 23M, for example, in the seventh layer 227 and the eighth layer 228 having low wiring densities of the first layer 221, the second layer 222, the third layer 223, the fourth layer 224, the fifth layer 225, the sixth layer 226, the seventh layer 227, and the eighth layer 228 included in the wiring layer 22. The multiple thin metal wires 227X1, 227X2, 227X3, 227X4, 228 X1, 228X2, 228X3, and 228X4 are formed at substantially the same pitches and disposed alternately in a plan view. The reflection region X having a substantially uniform reflection characteristic is thereby formed. This makes it possible to produce characteristic two-dimensional light intensity with reflection and transmission of the alignment light. Accordingly, it is possible to perform highly accurate alignment.

Further, in the present embodiment, the reflection region X is formed in the multiple layers having low wiring densities (in the present embodiment, the two layers, i.e., the seventh layer 227 and the eighth layer 228). Therefore, it is not necessary to secure a formation region for an alignment pattern 23M separately. This allows for a finer wiring pattern for electrically coupling the first substrate 100 and the multiple second substrates 300 (300A, 300B, 300C, and 300D), which makes it possible to expand an effective region. In addition, it is possible to improve the degree of freedom in the wiring layout of the wiring layers in layers lower than the reflection region X.

Further, it is possible to decease the first substrate and the multiple second substrates 300 in size. This allows for, for example, an increase in theoretical yield in a wafer, thereby making it possible to improve the yield as a result.

The following describes a second embodiment. It is to be noted that the following description denotes the same components as those of the first embodiment described above with the same symbols and the descriptions thereof are omitted as appropriate.

2. SECOND EMBODIMENT

Figure 10:
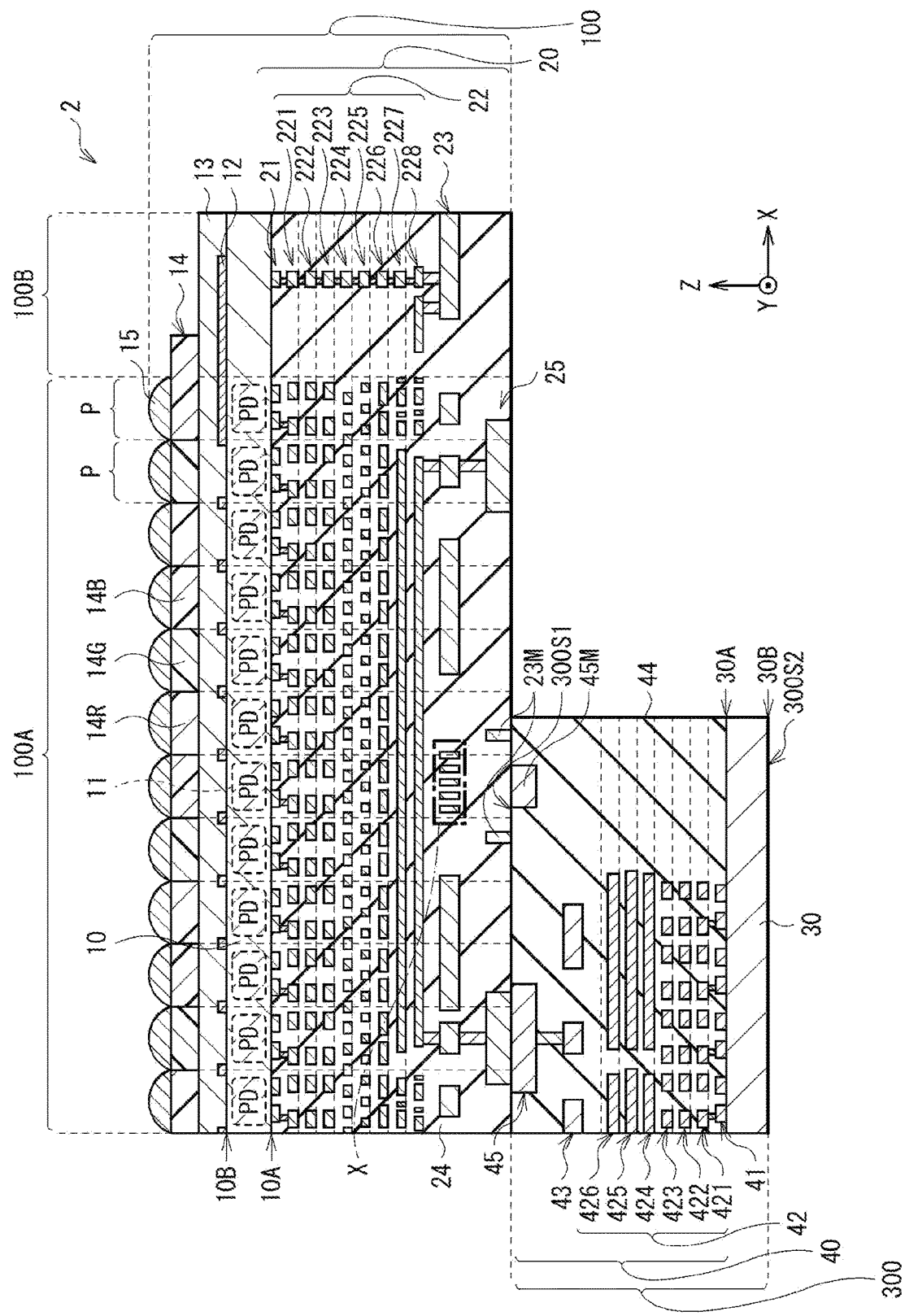
FIG. 10 is a schematic cross-sectional diagram illustrating a configuration of a solid-state imaging device according to a second embodiment of the present disclosure.

FIG. 10 schematically illustrates an example of a cross-sectional configuration of a solid-state imaging device (a solid-state imaging device 2) according to a second embodiment of the present disclosure. It is to be noted that FIG. 10 illustrates a cross section taken along a line I-I' illustrated in FIG. 2, as with FIG. 1 of the first embodiment described above. As with the solid-state imaging device 1 according to the first embodiment described above, the solid-state imaging device 2 is, for example, a CMOS image sensor to be used in an electronic apparatus such as a digital still camera or a video camera. The solid-state imaging device 2 of the present embodiment is different from the above-described first embodiment in that the alignment marks provided on the first substrate 100 and the second substrate 300 are provided to be exposed on the respective joining surfaces (alignment marks 25M and 45M). In addition, the solid-state imaging device 2 of the present embodiment is different from the above-described first embodiment in that the multiple thin metal wires forming the reflection region X having a uniform reflection characteristic are formed in one wiring layer (e.g., the wiring layer 23).

As described above, the alignment marks 25M and 45M are formed on the joining surfaces 100S2 and 300S1 of the first substrate 100 and the second substrate 300, respectively. Specifically, the alignment mark 25M is formed on the surface of the interlayer insulation layer 24 in the pixel region 100A, for example, together with multiple pad electrodes 25 to be used for joining with the second substrates 300A, 300B, 300C, and 300D. The alignment mark 45M is formed on the surface of the interlayer insulation layer 44 in a peripheral portion called a scribe line, for example, together with multiple pad electrodes 25 to be used for joining with the first substrate 100. The alignment marks 25M and 45M are formed using, for example, copper (Cu).

It is to be noted that the pad electrodes 25 formed on the joining surface 100S2 together with the alignment mark 25M are each provided with a barrier metal film formed between it and the interlayer insulation layer 24, for example. The pad electrodes 45 formed on the joining surface 300S1 together with the alignment mark 45M are each provided with a barrier metal film formed between it and the interlayer insulation layer 44, for example. The barrier metal film includes, for example, titanium (Ti). In the present embodiment, as with the first embodiment described above, the infrared light is applied from the surface 300S2 side which is the opposite side to the joining surface 300S1 of the second substrate 300 to perform detection of the alignment marks 25M and 45M. Therefore, it is preferable that the barrier metal film around the alignment mark 45M formed on the joining surface 300S1 be thinner than the barrier metal film around the pad electrode 45, or that the barrier metal film be removed. This improves visibility of the alignment mark 45M.

Figure 11:
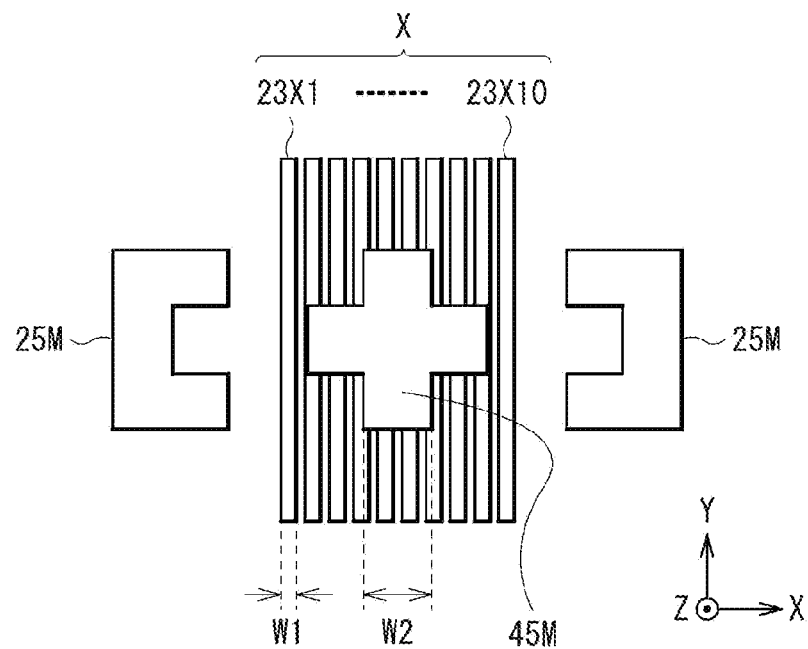
FIG. 11 is a schematic plan view describing the alignment mark and the reflection region illustrated in FIG. 10.

For example, as illustrated in FIG. 11, the reflection region X is formed, for example, at a position corresponding to the alignment mark 45M in a plan view. As described above, the reflection region X includes multiple thin metal wires 23X1 to 23X10 provided in the wiring layer 23. The reflection region X is disposed to be a region greater than or equivalent to an outer diameter of the alignment mark 45M in a plan view. The multiple thin metal wires 23X1 to 23X10 each extend, for example, in the Y-axis direction, and are arranged at predetermined pitches, for example, in the X-axis direction. The area or the volume of each of the multiple thin metal wires 23X1 to 23X10 is formed to be smaller than that of the alignment mark 45M formed above the reflection region X. In other words, for example, a width W1 of each of the multiple thin metal wires 23X1 to 23X10 in the X-axis direction is formed to be smaller than a width W2, in the X-axis direction, of an extending portion of the alignment mark 45M extending in the Y-axis direction. Further, the multiple thin metal wires 23X1 to 23X10 are disposed at pitches smaller than the wavelength of the alignment light, i.e., the wavelength of the infrared light (a wavelength within a range from 700 nm to 1400 nm both inclusive). Accordingly, the wiring patten of the multiple thin metal wires 23X1 to 23X10 is not recognized, and the reflection region X having a uniform reflection characteristic is formed.

Figure 12A:
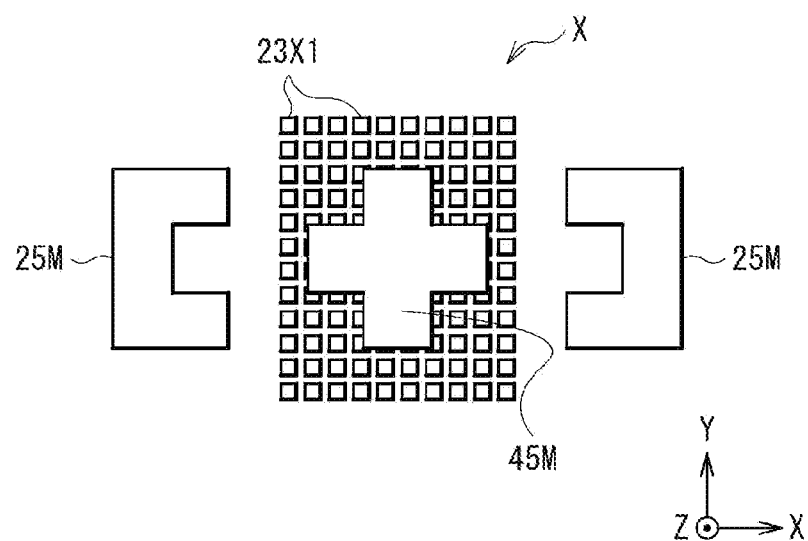
FIG. 12A is a schematic plan view describing another configuration example of the reflection region illustrated in FIG. 10.
Figure 12B:
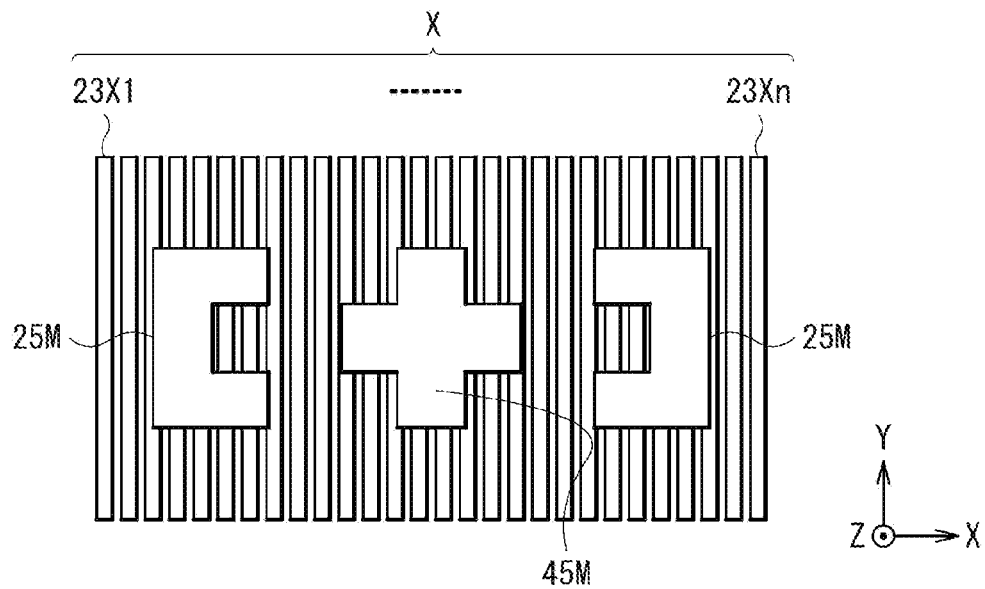
FIG. 12B is a schematic plan view describing another configuration example of the reflection region illustrated in FIG. 10.
Figure 12C:
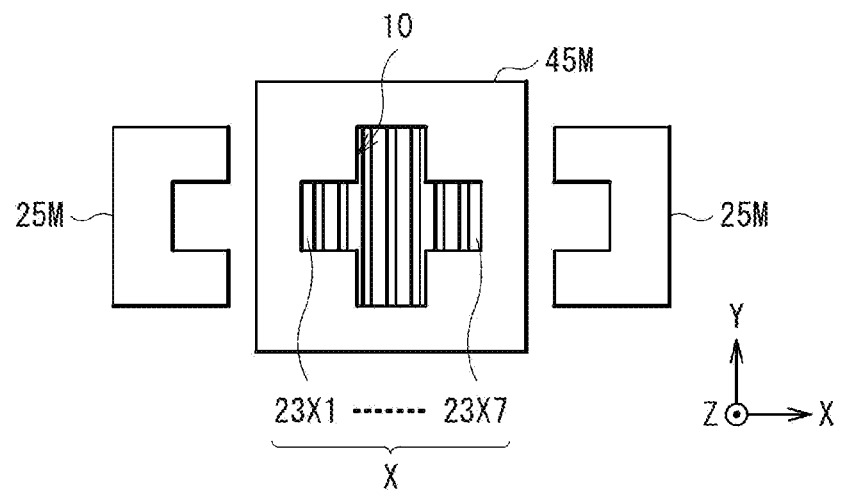
FIG. 12C is a schematic plan view describing another configuration example of the reflection region illustrated in FIG. 10.
Figure 12D:
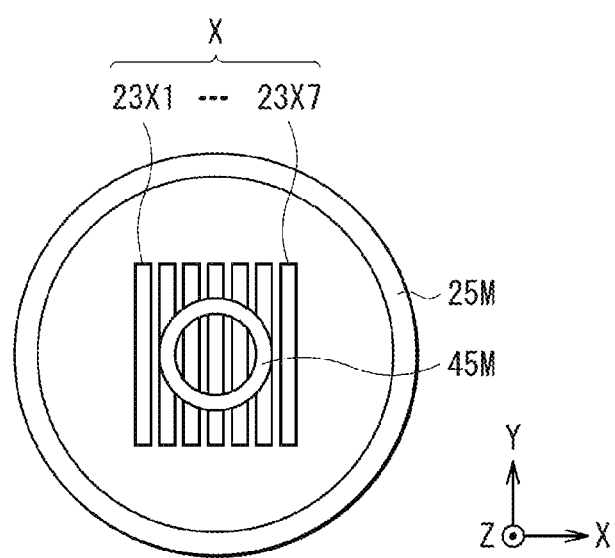
FIG. 12D is a schematic plan view describing another configuration example of the reflection region illustrated in FIG. 10.

It is to be noted that FIG. 11 illustrates an example in which the reflection region X includes the multiple thin metal wires 23X1 to 23X10 extending in one direction; however, this is non-limiting. It is sufficient that the reflection region X is disposed having a pitch smaller than the wavelength of the alignment light as described above. For example, as illustrated in FIG. 12A, it is possible to form the reflection region X by disposing, for example, multiple metal films 23X each having a rectangular shape in a matrix in the X-axis direction and the Y-axis direction. Further, FIG. 11 illustrates an example in which the reflection region X is formed only below the alignment mark 45M; however, this is non-limiting. For example, as illustrated in FIG. 12B, the reflection region X may further be formed to below the alignment mark 25M on the first substrate 100 side. Further, FIG. 11 illustrates an example in which the alignment mark 45M of a cross type is provided. However, for example, as illustrated in FIG. 12C, the alignment mark 45M may have, for example, a shape having a cross-type opening 45H in its surface. Furthermore, the respective shapes of the alignment marks 25M and 45M may be, for example, as illustrated in FIG. 12D, double circles when they are combined with each other. In this case, the reflection region X can be formed, for example, below the alignment mark 45M provided on the second substrate 200 side and forming an inner circle, for example, with the multiple thin metal wires 23X1 to 23X7 extending in the Y-axis direction.

Further, in the present embodiment, detection of the alignment marks 25M and 45M is performed by applying the infrared light from the surface 300S2 side which is the opposite side to the joining surface 300S1 of the second substrate 300. Therefore, it is desirable that no other wiring pattern be formed above the alignment marks 25M and 45M and between the alignment mark 25M and the multiple thin metal wires 23X1 to 23X10 included in the reflection region X. For example, it is desirable that only the interlayer insulation layers 24 and 44 be present. This makes it possible to detect the alignment marks 25M and 45M with high accuracy.

As described above, in the solid-state imaging device 2 of the present embodiment, the alignment marks 25M and 45M are provided on the joining surfaces 100S2 and 300S1 of the first substrate 100 and the second substrate 300, respectively, and the multiple thin metal wires (e.g., the thin metal wires 23X1 to 23X10) are disposed, for example, at the respective positions directly opposed to the alignment mark 45M in the wiring layer 23 of the multilayer wiring layer 20 included in the first substrate 100. The multiple thin metal wires are arranged at pitches smaller than the alignment light. Thus, the reflection region X having a uniform reflection characteristic is formed below the alignment mark 45M. Accordingly, it is possible to perform highly accurate alignment.

Further, as with the first embodiment described above, in the present embodiment, it is possible to provide a finer wiring pattern for electrically coupling the first substrate 100 and the multiple second substrates 300 (300A, 300B, 300C, and 300D), which makes it possible to expand the effective region. In addition, it is possible to improve the degree of freedom in the wiring layout of the wiring layers in layers lower than the reflection region X.

Further, it is possible to reduce the first substrate and the multiple second substrates 300 in size. This allows for, for example, an increase in theoretical yield in a wafer, making it possible to improve the yield as a result.

Furthermore, in the present embodiment, a description has been given of an example in which the pair of alignment marks 25M and 45M are provided on the joining surfaces 100S2 and 300S1 of the first substrate 100 and the second substrate 300, respectively. However, one or both thereof may be provided in the corresponding one of the multilayer wiring layers 20 and 40 or in the respective multilayer wiring layers 20 and 40, as in the first embodiment described above. It is to be noted that, for example, in a case where the alignment mark on the first substrate 100 side is formed in the wiring layer 23, the thin metal wires forming the reflection region X are formed in a wiring layer (e.g., the eighth layer 228) in a layer lower than the wiring layer 23.

3. APPLICATION EXAMPLE

Figure 13:
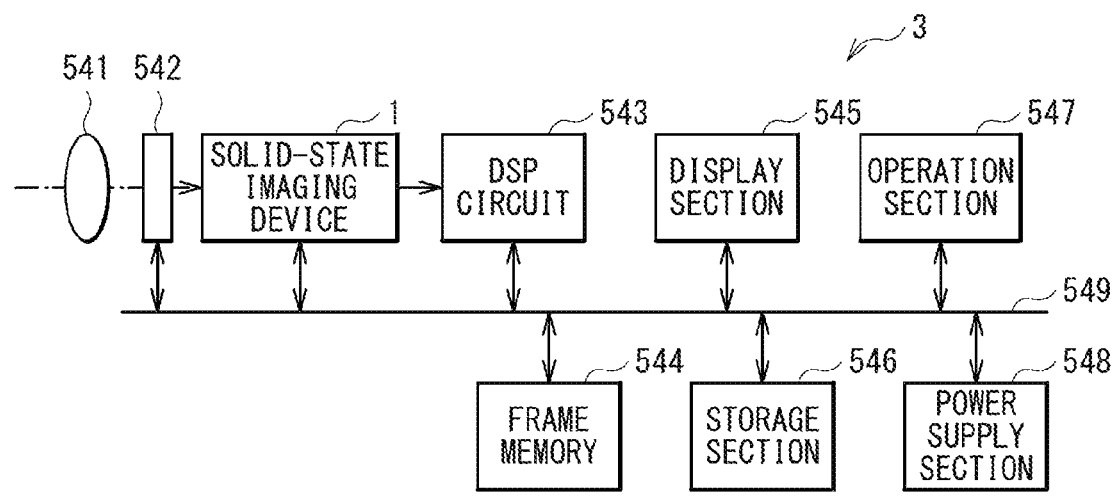
FIG. 13 is a diagram illustrating an example of a schematic configuration of an imaging system including the solid-state imaging device illustrated in FIG. 1, etc.

FIG. 13 illustrates an example of a schematic configuration of an imaging system 3 including the imaging device (e.g., the solid-state imaging device 1) according to any of the first and the second embodiments described above.

The imaging system 3 is an electronic apparatus including, for example, an imaging device such as a digital still camera or a video camera, a portable terminal device such as a smartphone or a tablet-type terminal, or the like. The imaging system 3 includes, for example, the solid-state imaging device 1 according to the first embodiment described above, an optical system 541, a shutter device 542, a DSP circuit 543, a frame memory 544, a display section 545, a storage section 546, an operation section 547, and a power supply section 548. In the imaging system 3, the solid-state imaging device 1, the shutter device 542, the DSP circuit 543, the frame memory 544, the display section 545, the storage section 546, the operation section 547, and the power supply section 548 are coupled to each other through a bus line 549.

The solid-state imaging device 1 outputs image data based on incident light. The optical system 541 includes one or multiple lenses. The optical system 541 guides light (incident light) from a subject to the solid-state imaging device 1, and forms an image on a light reception surface of the solid-state imaging device 1. The shutter device 542 is disposed between the optical system 541 and the solid-state imaging device 1, and controls respective periods of light application and light blocking with respect to the solid-state imaging device 1 in accordance with a control by the drive circuit. The DSP circuit 543 is a signal processing circuit that processes a signal (image data) outputted from the solid-state imaging device 1. The frame memory 544 temporarily holds the image data processed by the DSP circuit 543 on a frame-unit basis. The display section 545 includes, for example, a panel-type display device such as a liquid crystal panel or an organic EL (Electro Luminescence) panel, and displays a moving image or a still image captured by the solid-state imaging device 1. The storage section 546 records image data of the moving image or the still image captured by the solid-state imaging device 1 in a recording medium such as a semiconductor memory or a hard disk. The operation section 547 issues an operation instruction regarding various functions of the imaging system 3 in accordance with an operation performed by a user. The power supply section 548 appropriately supplies various kinds of power for operation to the solid-state imaging device 1, the DSP circuit 543, the frame memory 544, the display section 545, the storage section 546, and the operation section 547 that are supply targets.

Next, an imaging procedure in the imaging system 3 is described.

Figure 14:
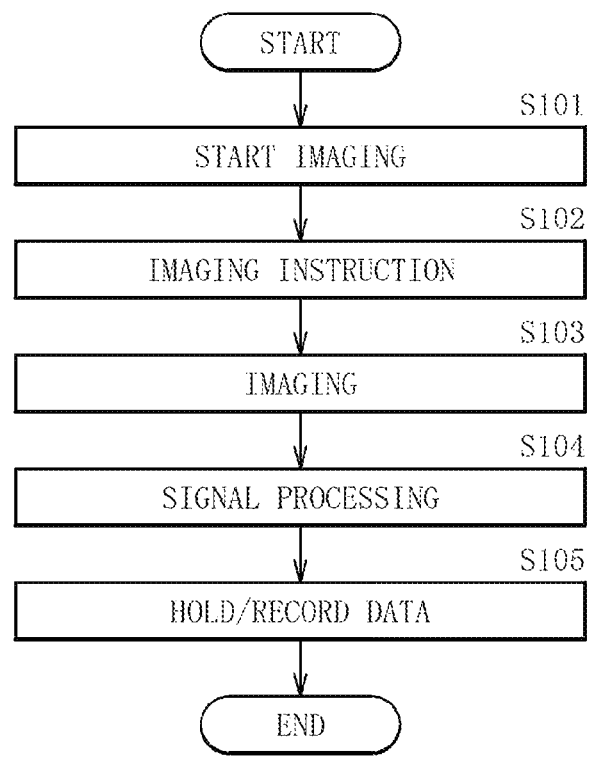
FIG. 14 is a diagram illustrating an example of an imaging procedure in the imaging system in FIG. 13.

FIG. 14 illustrates an example of a flowchart of an imaging operation in the imaging system 3. A user issues an instruction to start imaging by operating the operation section 547 (step S101). The operation section 547 then transmits an imaging instruction to the solid-state imaging device 1 (step S102). The solid-state imaging device 1 (specifically, a system control circuit) executes imaging in a predetermined imaging scheme upon receiving the imaging instruction (step S103).

The solid-state imaging device 1 outputs image data obtained through imaging to the DSP circuit 543. Here, the image data refers to data, for all of the pixels, of pixel signals generated on the basis of electric charge temporarily held by a floating diffusion FD. The DSP circuit 543 performs predetermined signal processing (e.g., noise reduction processing or the like) on the basis of the image data inputted from the solid-state imaging device 1 (step S104). The DSP circuit 543 causes the frame memory 544 to hold the image data subjected to the predetermined signal processing, and the frame memory 544 causes the storage section 546 to store the image data (step S105). In this way, the imaging in the imaging system 3 is performed.

In the present application example, the solid-state imaging device 1, the solid-state imaging device 2, or the like is applied to the imaging system 3. This allows the solid-state imaging device 1, the solid-state imaging device 2, or the like to be smaller in size or higher in definition. Accordingly, it is possible to provide the small-sized or high-definition imaging system 3.

4. PRACTICAL APPLICATION EXAMPLES

Practical Application Example 1

The technology (the present technology) according to the present disclosure is applicable to a variety of products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

Figure 15:
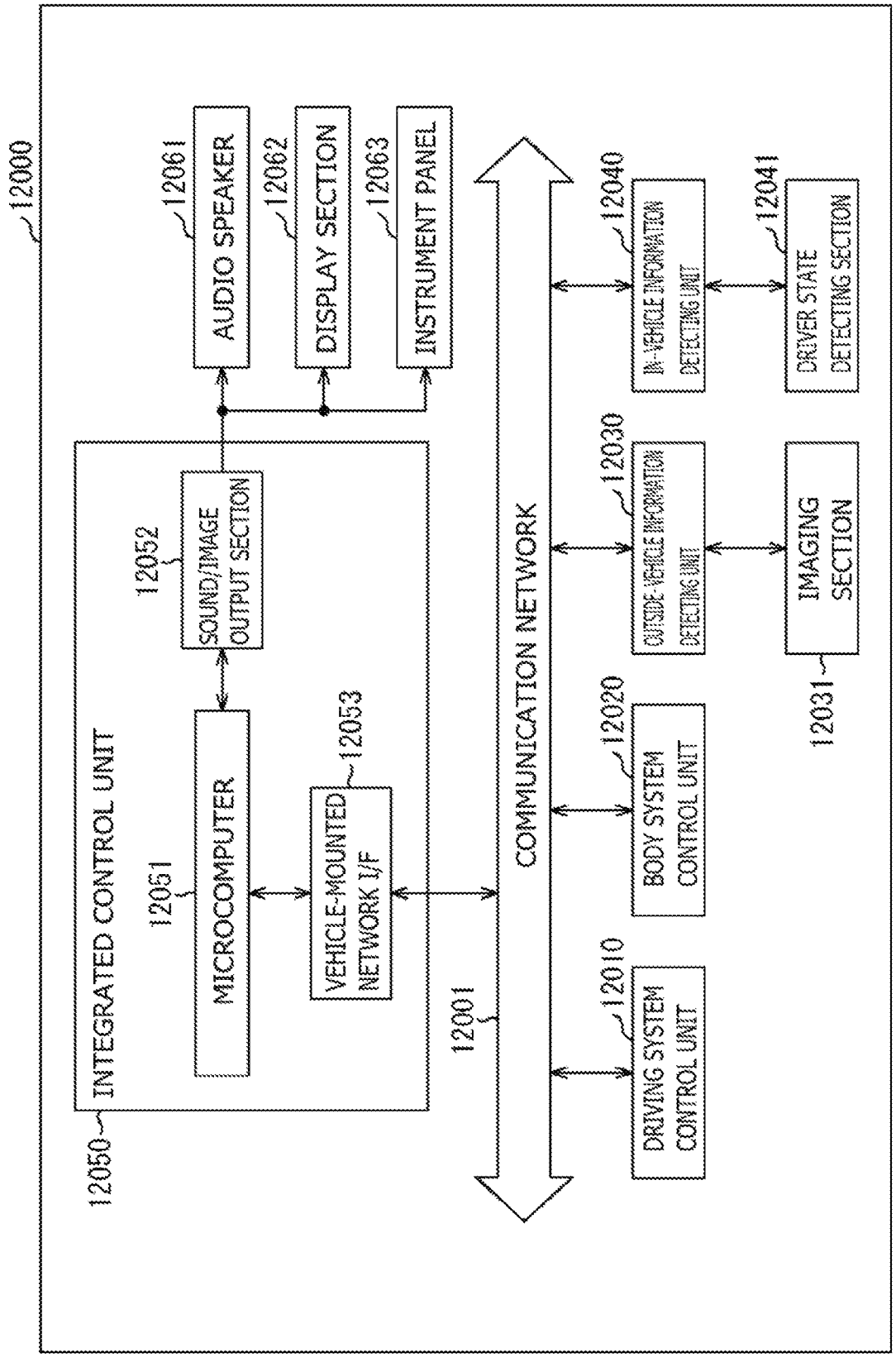
FIG. 15 is a block diagram depicting an example of schematic configuration of a vehicle control system.

FIG. 15 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 15, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 57, an audio speaker 12061, a display section 12062, and an instrument panel 12063 are illustrated as the output device. The display section 12062 may, for example, include at least one of an on-board display and a head-up display.

Figure 16:
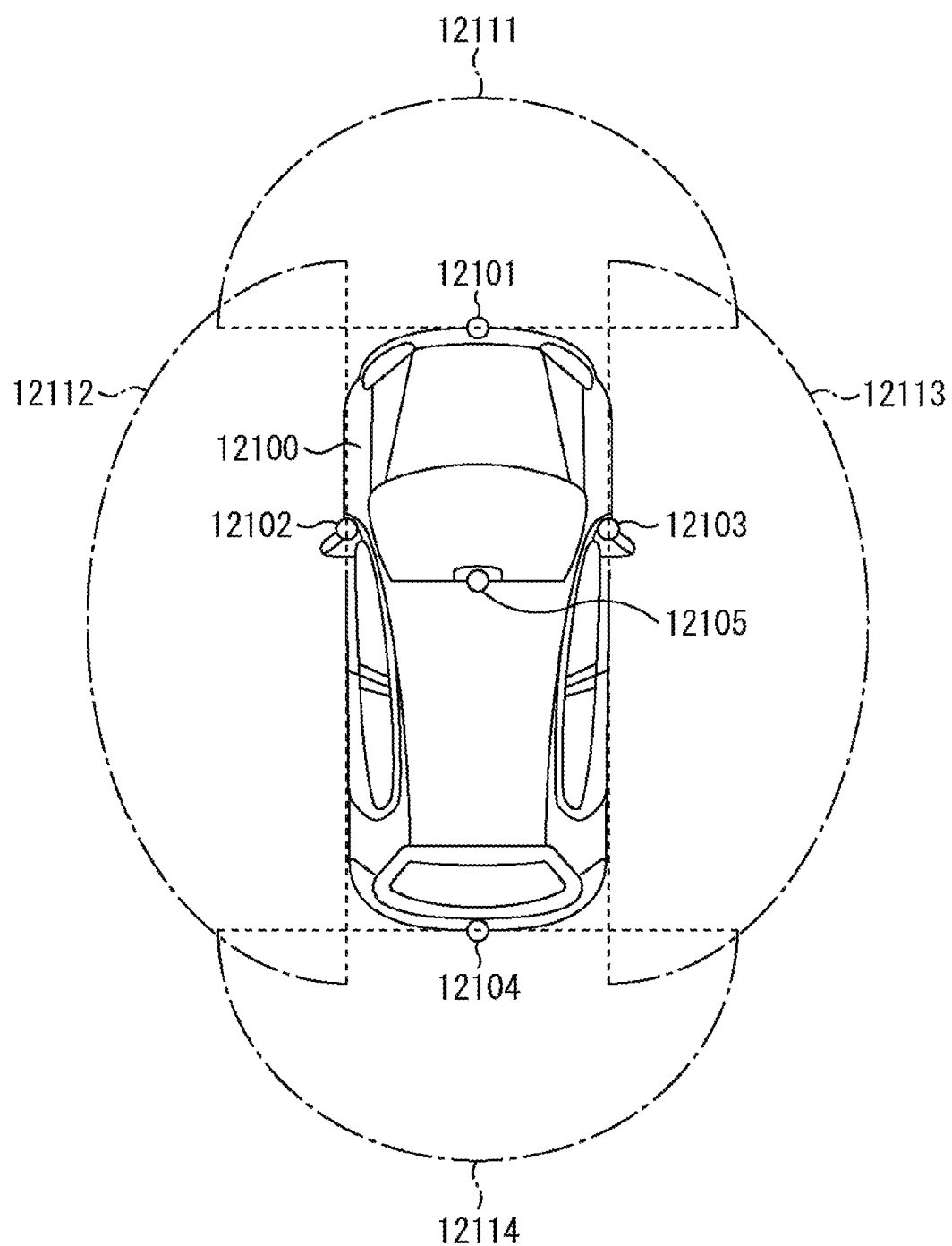
FIG. 16 is a diagram of assistance in explaining an example of installation positions of an outside-vehicle information detecting section and an imaging section.

FIG. 16 is a diagram depicting an example of the installation position of the imaging section 12031.

In FIG. 16, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 16 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The above has described the example of the mobile body control system to which the technology according to the present disclosure is applicable. The technology according to the present disclosure is applicable to the imaging section 12031 among the components described above. Specifically, the solid-state imaging devices 1 and 2 respectively according to the first and the second embodiments described above are each applicable to the imaging section 12031. The application of the technology according to the present disclosure to the imaging section 12031 makes it possible to obtain a captured image with high definition and less noise, and it is thus possible to perform highly accurate control using the captured image in the mobile body control system.

Practical Application Example 2

Figure 17:
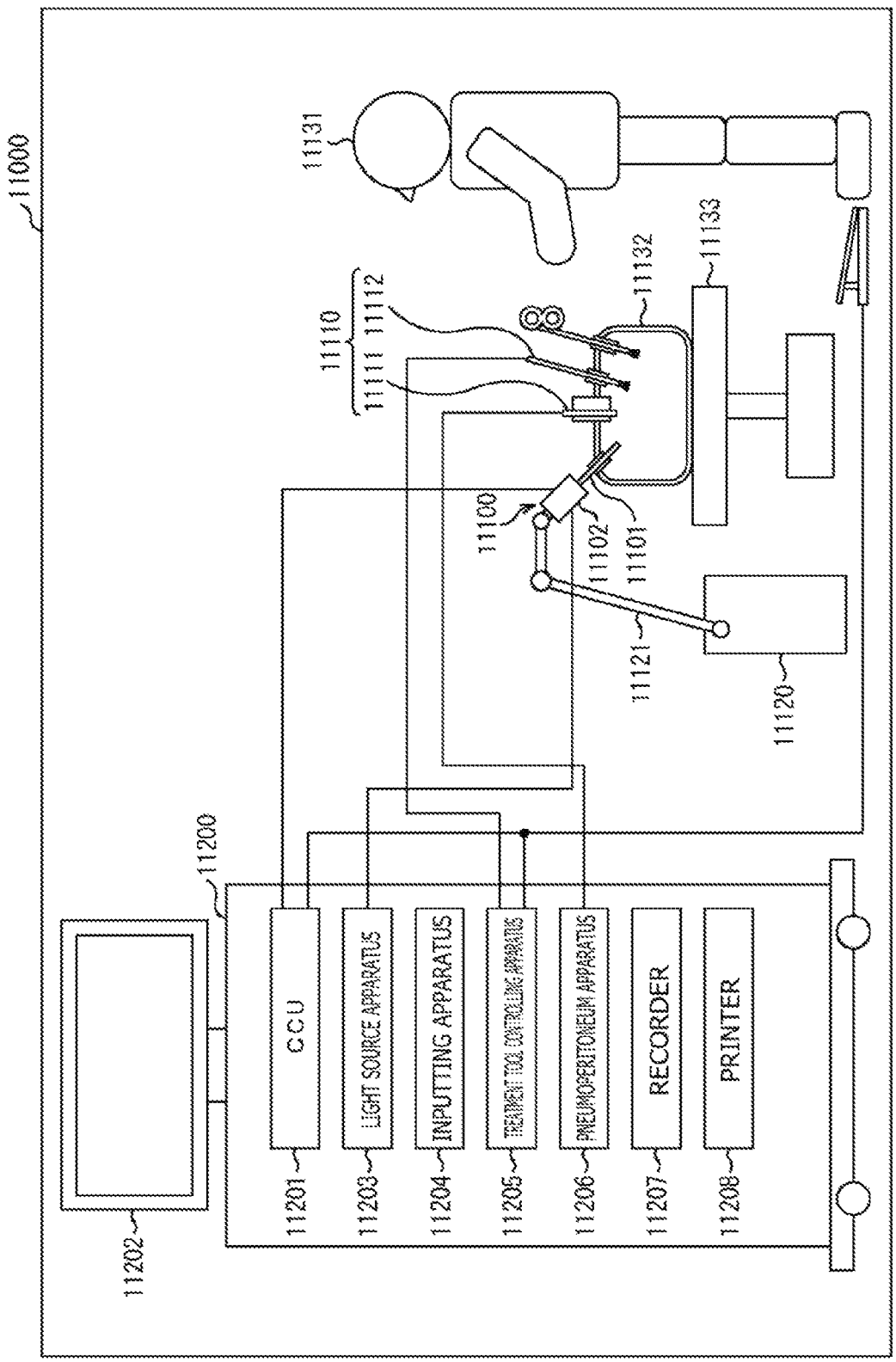
FIG. 17 is a view depicting an example of a schematic configuration of an endoscopic surgery system.

FIG. 17 is a view depicting an example of a schematic configuration of an endoscopic surgery system to which the technology according to an embodiment of the present disclosure (present technology) can be applied.

In FIG. 17, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 18:
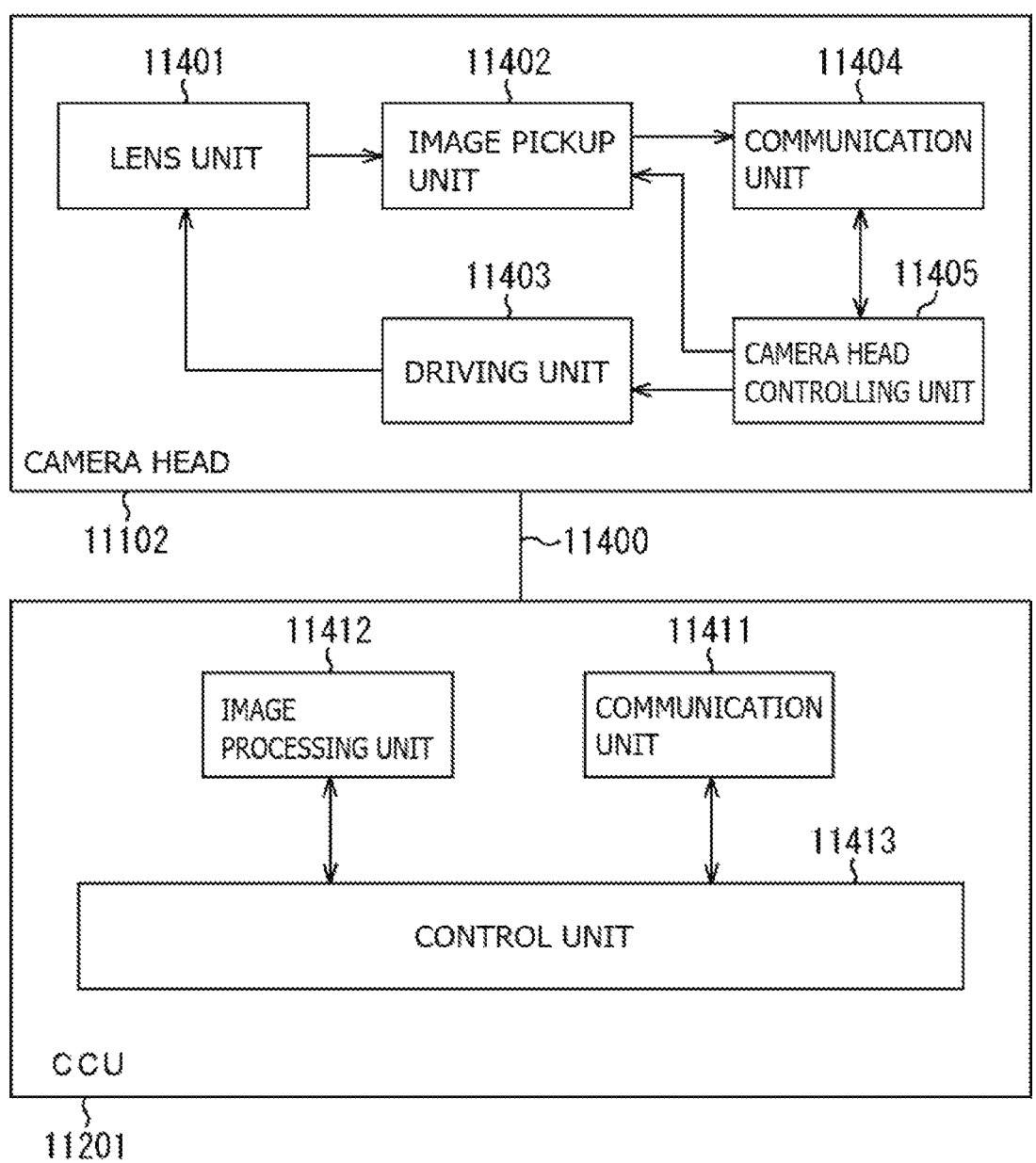
FIG. 18 is a block diagram depicting an example of a functional configuration of a camera head and a camera control unit (CCU).

FIG. 18 is a block diagram depicting an example of a functional configuration of the camera head 11102 and the CCU 11201 depicted in FIG. 17.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

Although the present disclosure has been described above with reference to the first and the second embodiments, the application example, and the practical application examples, the present disclosure is not limited to the embodiments and the like described above. A variety of modifications are possible. For example, in the embodiments and the like described above, a description has been given of an example in which the multiple second substrates 300 (the second substrates 300A, 300B, 300C, and 300D) are attached to the first substrate 100. However, the present technology is able to achieve similar effects also in a case where one first substrate 100 and one second substrate 300 are attached to each other.

It is to be noted that the effects described herein are merely illustrative. The effects according to the present disclosure are not limited to the effects described herein. The present disclosure may have effects other than the effects described herein.

It is to be noted that the present disclosure may also have configurations as follows. According to the present technology having the following configurations, it is possible to form the reflection region having a substantially uniform reflection characteristic in a lower layer of the first alignment part. This allows for highly accurate alignment.

(1)
A solid-state imaging device including:
a first substrate including a first semiconductor substrate in which multiple photoelectric conversion sections are formed to be embedded, and a multilayer wiring layer formed on one surface side of the first semiconductor substrate, the multiple photoelectric conversion sections being included in a sensor pixel;
one or multiple second substrates attached to the first substrate with the multilayer wiring layer interposed therebetween;
a first wiring layer provided in the multilayer wiring layer and including multiple first thin metal wires formed at substantially same first pitches;
a second wiring layer stacked above the first wiring layer in the multilayer wiring layer and including multiple second thin metal wires formed between the multiple first thin metal wires at substantially same second pitches in a plan view; and a first alignment part formed above the second wiring layer in the multilayer wiring layer.

(2)
The solid-state imaging device according to (1) described above, in which at least one member of the first thin metal wire, the second thin metal wire, or the first alignment part has an optical constant different from those of other members.

(3)
The solid-state imaging device according to (1) or (2) described above, in which the multiple first thin metal wires and the multiple second thin metal wires form a reflection region having a substantially uniform reflection characteristic.

(4)
The solid-state imaging device according to (3) described above, in which the multiple first thin metal wires and the multiple second thin metal wires are disposed periodically and alternately in the reflection region in a plan view.

(5)
The solid-state imaging device according to (3) or (4) described above, in which the multiple first thin metal wires and the multiple second thin metal wires are disposed alternately with no gap in the reflection region in a plan view.

(6)
The solid-state imaging device according to any one of (3) to (5) described above, in which the first alignment part is formed in the reflection region in a plan view.

(7)
The solid-state imaging device according to any one of (1) to (6) described above, in which
the multiple first thin metal wires and the multiple second thin metal wires each extend in a first direction, and
the first alignment part includes an extending portion extending in a second direction that intersects with the first direction.

(8)
The solid-state imaging device according to (7) described above, in which the first direction and the second direction are orthogonal to each other.

(9)
The solid-state imaging device according to any one of (1) to (8) described above, in which the second substrate includes a second alignment part at a position corresponding to the first alignment part in a plan view.

(10)
The solid-state imaging device according to (9) described above, in which
the multiple first thin metal wires and the multiple second thin metal wires form a reflection region having a substantially uniform reflection characteristic, and
no wiring pattern is formed above the first alignment part and the second alignment part and between the first alignment part and the reflection region in a plan view.

(11)
The solid-state imaging device according to any one of (1) to (10) described above, further including a metal layer between the first alignment part and the second wiring layer, the metal layer having an optical constant different from those of the first alignment part and the multiple second thin metal wires.

(12)

The solid-state imaging device according to any one of (1) to (11) described above, in which
the multiple first thin metal wires and the multiple second thin metal wires are each formed to include copper, and
the first alignment part is formed to include aluminum.

(13)

The solid-state imaging device according to (11) described above, in which the metal layer is formed to include titanium.

(14)

A solid-state imaging device including:
a first substrate including a first semiconductor substrate in which multiple photoelectric conversion sections are formed to be embedded, and a multilayer wiring layer formed on one surface side of the first semiconductor substrate, the multiple photoelectric conversion sections being included in a sensor pixel;
one or multiple second substrates attached to the first substrate with the multilayer wiring layer interposed therebetween;
a first alignment part provided in the multilayer wiring layer and being to be detected by detection light having a predetermined wavelength; and
a wiring layer formed below the first alignment part in the multilayer wiring layer and including multiple thin metal wires formed at a pitch smaller than the wavelength of the detection light.

(15)

The solid-state imaging device according to (14) described above, in which only an insulation layer is formed between the first alignment part and the wiring layer.

(16)

The solid-state imaging device according to (14) or (15) described above, in which the first alignment part is formed on a joining surface being joined with the second substrate.

(17)

The solid-state imaging device according to any one of (14) to (16) described above, in which the second substrate includes a second alignment part at a position corresponding to the first alignment part in a plan view.

(18)

The solid-state imaging device according to (17) described above, in which the second alignment part is formed on a joining surface being joined with the first substrate.

(19)

The solid-state imaging device according to (17) or (18) described above, in which an area of each of the multiple thin metal wires is smaller than respective areas of the first alignment part and the second alignment part.

(20)

The solid-state imaging device according to any one of (17) to (19) described above, in which the multiple thin metal wires are formed in a region greater than or equivalent to an outer diameter of the second alignment part.

(21)

The solid-state imaging device according to any one of (14) to (20) described above, in which the detection light is infrared light having a wavelength of greater than or equal to 700 nm and less than or equal to 1400 nm.

This application claims the priority on the basis of Japanese Patent Application No. 2020-057974 filed with Japan Patent Office on Mar. 27, 2020, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A solid-state imaging device, comprising:
a first substrate including a first semiconductor substrate in which multiple photoelectric conversion sections are formed to be embedded, and a multilayer wiring layer formed on one surface side of the first semiconductor substrate, the multiple photoelectric conversion sections being included in a sensor pixel;
one or multiple second substrates attached to the first substrate with the multilayer wiring layer interposed therebetween;
a first wiring layer provided in the multilayer wiring layer and including multiple first thin metal wires formed at substantially same first pitches;
a second wiring layer stacked above the first wiring layer in the multilayer wiring layer and including multiple second thin metal wires formed between the multiple first thin metal wires at substantially same second pitches in a plan view; and
a first alignment part formed above the second wiring layer in the multilayer wiring layer.

2. The solid-state imaging device according to claim 1, wherein at least one member of the first thin metal wire, the second thin metal wire, or the first alignment part has an optical constant different from those of other members.

3. The solid-state imaging device according to claim 1, wherein the multiple first thin metal wires and the multiple second thin metal wires form a reflection region having a substantially uniform reflection characteristic.

4. The solid-state imaging device according to claim 3, wherein the multiple first thin metal wires and the multiple second thin metal wires are disposed periodically and alternately in the reflection region in a plan view.

5. The solid-state imaging device according to claim 3, wherein the multiple first thin metal wires and the multiple second thin metal wires are disposed alternately with no gap in the reflection region in a plan view.

6. The solid-state imaging device according to claim 3, wherein the first alignment part is formed in the reflection region in a plan view.

7. The solid-state imaging device according to claim 1, wherein
the multiple first thin metal wires and the multiple second thin metal wires each extend in a first direction, and
the first alignment part includes an extending portion extending in a second direction that intersects with the first direction.

8. The solid-state imaging device according to claim 7, wherein the first direction and the second direction are orthogonal to each other.

9. The solid-state imaging device according to claim 1, wherein the second substrate includes a second alignment part at a position corresponding to the first alignment part in a plan view.

10. The solid-state imaging device according to claim 9, wherein
the multiple first thin metal wires and the multiple second thin metal wires form a reflection region having a substantially uniform reflection characteristic, and
no wiring pattern is formed above the first alignment part and the second alignment part and between the first alignment part and the reflection region in a plan view.

11. The solid-state imaging device according to claim 1, further comprising a metal layer between the first alignment part and the second wiring layer, the metal layer having an optical constant different from those of the first alignment part and the multiple second thin metal wires.

12. The solid-state imaging device according to claim 1, wherein
the multiple first thin metal wires and the multiple second thin metal wires are each formed to include copper, and
the first alignment part is formed to include aluminum.

13. The solid-state imaging device according to claim 11, wherein the metal layer is formed to include titanium.

14. A solid-state imaging device, comprising:
a first substrate including a first semiconductor substrate in which multiple photoelectric conversion sections are formed to be embedded, and a multilayer wiring layer formed on one surface side of the first semiconductor substrate, the multiple photoelectric conversion sections being included in a sensor pixel;
one or multiple second substrates attached to the first substrate with the multilayer wiring layer interposed therebetween;
a first alignment part provided in the multilayer wiring layer and being to be detected by detection light having a predetermined wavelength; and
a wiring layer formed below the first alignment part in the multilayer wiring layer and including multiple thin metal wires formed at a pitch smaller than the wavelength of the detection light.

15. The solid-state imaging device according to claim 14, wherein only an insulation layer is formed between the first alignment part and the wiring layer.

16. The solid-state imaging device according to claim 14, wherein the first alignment part is formed on a joining surface being joined with the second substrate.

17. The solid-state imaging device according to claim 14, wherein the second substrate includes a second alignment part at a position corresponding to the first alignment part in a plan view.

18. The solid-state imaging device according to claim 17, wherein the second alignment part is formed on a joining surface being joined with the first substrate.

19. The solid-state imaging device according to claim 17, wherein an area of each of the multiple thin metal wires is smaller than respective areas of the first alignment part and the second alignment part.

20. The solid-state imaging device according to claim 17, wherein the multiple thin metal wires are formed in a region greater than or equivalent to an outer diameter of the second alignment part.

* * * * *